United States Patent
Balasubramanian et al.

(10) Patent No.: US 9,530,488 B1
(45) Date of Patent: Dec. 27, 2016

(54) METHODS, APPARATUS AND SYSTEM DETERMINING DUAL PORT DC CONTENTION MARGIN

(71) Applicant: GLOBALFOUNDRIES INC., Grand Cayman, KY (US)

(72) Inventors: Sriram Balasubramanian, Santa Clara, CA (US); Vivek Joshi, San Jose, CA (US); Randy W. Mann, Milton, NY (US); Ratheesh Ramachandran Thankalekshmi, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/048,583

(22) Filed: Feb. 19, 2016

(51) Int. Cl.
*G11C 29/50* (2006.01)
*G11C 11/419* (2006.01)
*G11C 29/44* (2006.01)

(52) U.S. Cl.
CPC ............. *G11C 11/419* (2013.01); *G11C 29/44* (2013.01); *G11C 29/50* (2013.01)

(58) Field of Classification Search
CPC ....................................................... G11C 29/50
USPC ................................................ 365/201, 156
See application file for complete search history.

(56) References Cited

U.S. PATENT DOCUMENTS

| | | | | |
|---|---|---|---|---|
| 6,510,076 B1* | 1/2003 | Lapadat | ............. | G11C 11/4125 365/154 |
| 7,689,941 B1* | 3/2010 | Ooi | ............. | G06F 17/5036 703/14 |
| 2002/0110024 A1* | 8/2002 | Ouellette | ............. | G11C 29/02 365/189.04 |
| 2010/0275074 A1* | 10/2010 | Nicolaidis | ............. | G11C 29/56 714/718 |

\* cited by examiner

*Primary Examiner* — Hoai V Ho
*Assistant Examiner* — Jay Radke
(74) *Attorney, Agent, or Firm* — Williams Morgan, P.C.

(57) ABSTRACT

At least one method, apparatus and system disclosed involves testing a dual port memory cell in a memory device. A semiconductor wafer is processed for providing a dual port memory device. An inline DC contention margin test is performed for testing a contention margin related to a write operation into a cell of the memory device. A determination is made as to whether the contention margin is within a predetermined range. A responsive action is performed in response to determining that the contention margin is outside the predetermined range.

20 Claims, 9 Drawing Sheets

METHODS, APPARATUS AND SYSTEM DETERMINING DUAL PORT DC CONTENTION MARGIN

FIELD OF THE INVENTION

Generally, the present disclosure relates to the manufacture of sophisticated semiconductor devices, and, more specifically, to various methods and structures for determining DC contention margins for integrated circuit devices, such as memory devices.

DESCRIPTION OF THE RELATED ART

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot, using semiconductor-manufacturing tools, such as exposure tool or a stepper. As an example, an etch process may be performed on the semiconductor wafers to shape objects on the semiconductor wafer, such as polysilicon lines, each of which may function as a gate electrode for a transistor. As another example, a plurality of metal lines, e.g., aluminum or copper, may be formed that serve as conductive lines that connect one conductive region on the semiconductor wafer to another. Since various processing steps are performed in manufacturing integrated circuits, manufacturing variations may cause slight differences (e.g., biasing relating to bit state) from one device to another.

Using the various manufacturing steps described above, integrated circuit chips, such as memory devices (e.g., Static Random Access Memory [SRAM]), may be fabricated. State of the art SRAM devices are generally either single-port devices or dual-port devices. Typical SRAM devices comprise memory cells that are made up of six transistors (e.g. MOSFETs), the so-called 6 T SRAMs. Typical SRAM devices comprise a signal port to access a 6 T cell, wherein a read or a write operation is performed via the single port. In this case, there may be a delay in accessing data from and/or writing into, the 6 T memory cells due to the limitations resulting from having only a single port. Therefore, the bandwidth of data flow to and from 6 T memory cells may be limited. However, some applications, such as image and video processing, call improved access to memory (e.g., parallel array access) in order to improve bandwidth.

In order to address the demand for improved memory access, designers have implemented dual port access to SRAM memory cells. FIG. 1 illustrates a pair of typical dual port SRAM memory cell. An SRAM memory cell 100 comprises two dual port cells: a $1^{st}$ cell 110 and a $2^{nd}$ cell 120. Each cell 110, 120 comprises a plurality of transistors 130a that form two cross-coupled inverters, while additional transistors 130b provide access control for read and write operations. For dual port cells 100, additional transistors 130 are provided for dual port access control.

The dual port memory cell 100 comprises two ports, port A and port B. The cell 100 comprises two word line signals, WLA 140 and WLB 145. Further, the dual port memory cell 100 comprises bit line signals for each port. The $1^{st}$ cell 110 comprises bit line true signals BLTA1 150 and BLTB1 154, and bit line complimentary signals BLCA1 156, and BLCB1 152 ("A" designation for port A and "B" designation for port B). The $2^{nd}$ cell 120 comprises bit line true signals BLTA2 160 and BLTB2 164 and bit line complimentary signals BLCA2 166, and BLCB2 162. If a "true" bit line signal is coupled to Vdd (logic high), the related "complimentary" bit line signal would be coupled to Vss (logic low) and vice versa, as shown in FIG. 1. The word line signals and the bit line signals of FIG. 1 are driven to various assertions states to perform read and write operations using the dual ports (port A and port B) of the memory cell 100.

One problem with dual port devices is contention margin errors. Read or write operation must be performed within required time constraints. That is, in dual port cells, contention errors could easily occur due to the larger number of permutations of read and write operations that could occur in rapid fashion. During read or write operations, inadvertent changes to the state of a cell may be made during rapid read and/or write access via the dual port cells. For example, if a write access were to be performed by a processor on a port while another circuit entity attempts a read operation via another port, a contention error between the read and write operations could cause failure.

As noted above, in addition to the dual port cell 1 (110), the device 100 also comprises a second dual port cell, i.e., cell 2 (120). Examples of contention errors may occur in the scenario-cases provided below. In one example, a contention error may occur during a single read/write mode in different row access, which calls for access to port A with WLA 140 at Vdd and WLB 145 at Vss (case-1). In another example, a contention error occur during a single read/write mode in which different row access may call for access to port B with WLA 140 at Vss and WLB 145 at Vdd (case-2).

In another example, a contention error may occur in a dual-read, same-row access scenario. When word line signals WLA 140 and WLB 145 are pulled to Vdd, during a read or a write operation, other cells in the same row may experience a dummy read through half-select (case-3).

Other contentions scenarios include during same-row access, wherein full or partial contentions may occur. Full contention refers to contentions that occur when accessing the same cell. Partial contention refers to contentions that occur when accessing the different cells. For example, a contention error may occur during a write operation where WLA 140 and WLB 145 are Vdd and port B is pre-charged, in which a write operation from port A may cause a dummy read on port B (case-4). As another example, a contention error may occur during a read operation where WLA 140 and WLB 145 are Vdd and port A is pre-charged, in which a write operation from port B may cause a dummy read on port A (case-5).

During manufacturing of dual port memory devices, it is difficult to perform full yield testing of significant number of devices to ensure that the batch of wafer being processed would not yield large number of devices that could have contention errors. State of the art AC test may be performed, which calls for performing read and write operations on all of the cells. However, this process is too cumbersome and time consuming, negatively affecting manufacturing of dual port devices. The so-called DC tests may be more efficient, however, the state of the art lacks DC equivalent test for performing contention testing for read and write contentions. Therefore, in the state of the art, it is difficult to properly test and quantify performance of dual port memory devices using state of the art testing processes. As such, many designers and manufacturers have been discouraged to design and manufacture dual port memory devices. However, there is a significant desire to use higher bandwidth afforded by dual port memory devices for certain applications, such as video and image processing applications.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for testing a dual port memory cell in a memory device. A semiconductor wafer is processed for providing a dual port memory device. An inline DC contention margin test is performed for testing a contention margin related to a write operation into a cell of the memory device. A determination is made as to whether the contention margin is within a predetermined range. A responsive action is performed in response to determining that the contention margin is outside the predetermined range.

BRIEF DESCRIPTION OF THE DRAWINGS

The disclosure may be understood by reference to the following description taken in conjunction with the accompanying drawings, in which like reference numerals identify like elements, and in which.

Figure 1:
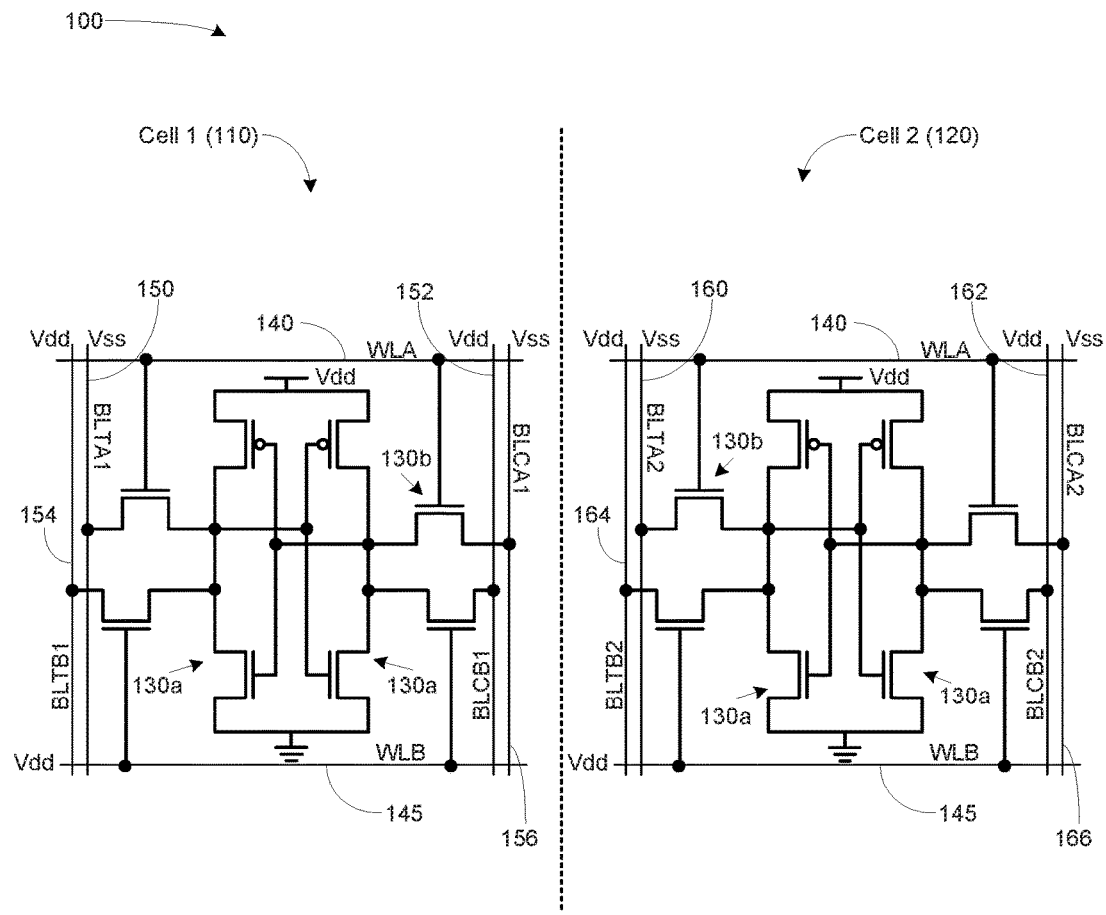
FIG. 1 illustrates stylized depiction of a typical dual port SRAM memory cell.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for a testing process during processing of semiconductor wafers for manufacturing memory devices. Embodiments herein provide for providing DC in-line testing for read and write functions for dual port memory devices (e.g., SRAM memory devices). The testing provided by embodiments herein provide for determining read and write contention margins of memory devices being manufactured. These tests may be performed in an inline fashion in substantially early part of processing, e.g., at early metal layer processing steps, such as M2 metal layer processing steps. In this manner there may be lower amount of overhead in performing the testing provided by embodiments herein.

The DC contention margin testing provided herein may be used to track the nature of read-write contentions in a fab inline environment. The results of the DC contention tests may be compared with transient margins from full transient testing for performing calibration of processing. The DC contention margin testing of embodiments herein may be implemented using bit line or word line voltages. The DC contention margin testing of embodiments herein may be performed for full contention and/or partial contention. The DC contention margin testing may be performed using a bit line contention margin (BCM) test, a word line contention margin (WCM) test, a negative bit line contention margin (NBL) test, and/or a word line overdrive contention margin (WOM) test.

Based upon the contention margin testing of embodiments herein, one or more processing and/or design feedback adjustment may be made. For example, some design feedback adjustments that adjust one or more processing steps to adjust timing of the memory device may be made. In other embodiments, processing adjustments, such as deposition thickness adjustments, etching time periods, etc., may be performed to adjust the operation of the memory devices in order to improve contention margins. Further, in some embodiments, based upon the results of the testing of embodiments herein, the specifications of the memory device under manufacture may be re-characterized to reflect the actual contention margins.

Figure 2:
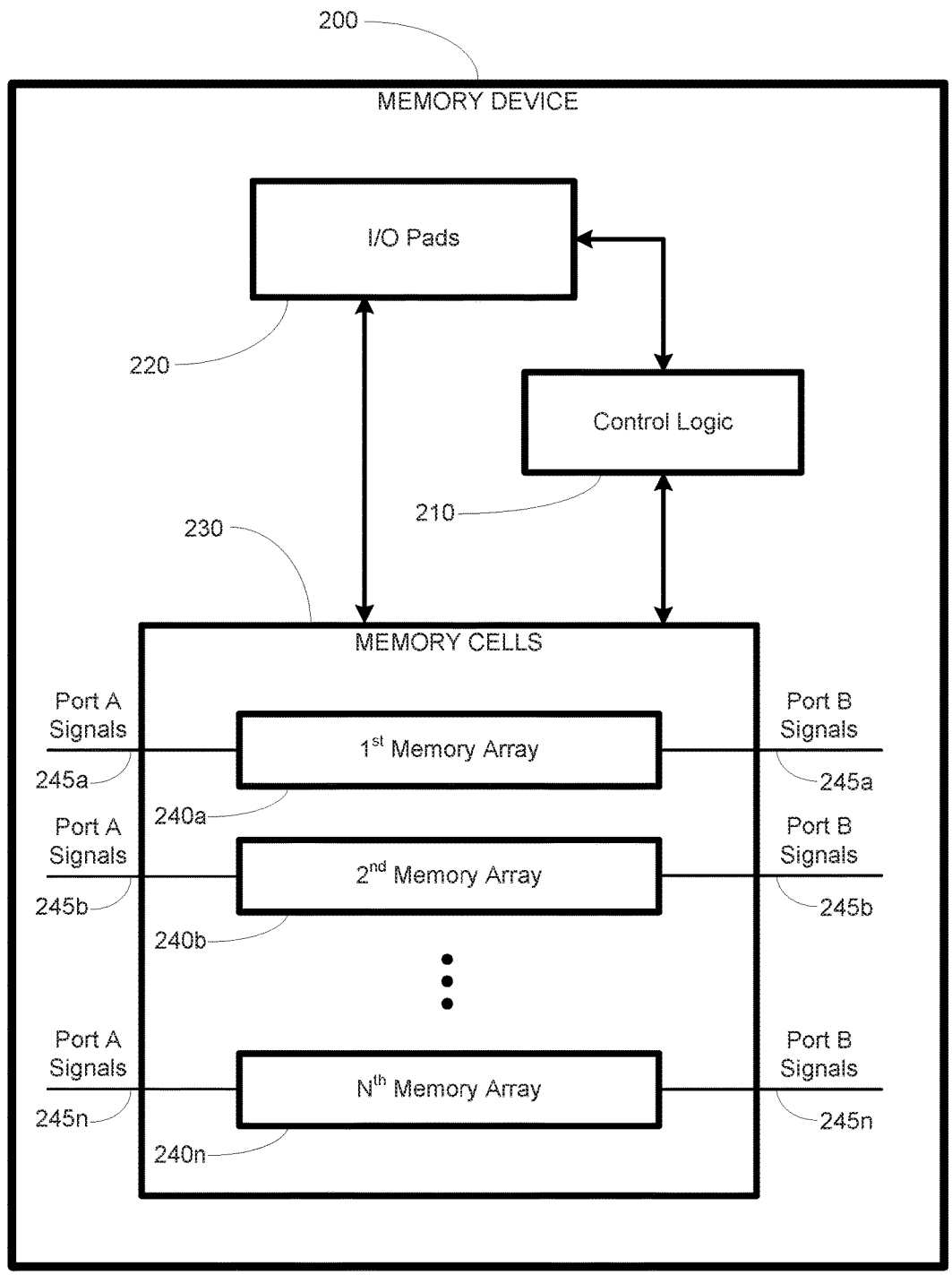
FIG. 2 illustrates stylized block diagram depiction of a memory device of manufactured using testing processes described in embodiments herein.

Turning now to FIG. 2, a stylized block diagram depiction of a memory device of manufactured using testing processes described in embodiments herein, is illustrated. The memory device 200 may comprise a plurality of I/O pads 220 and provide access to and from the memory device 200. The memory device 200 also comprises a memory cells 230 portion, which may comprise a first memory array 240*a*, a second memory array 240*b*, through an N$^{th}$ memory array 240*n* (collectively "240").

Each of the memory cells 240 is manufactured using testing and/or feedback processing or design adjustments provided by embodiments herein. Each of the memory arrays 240 provide for dual port access. Each of the memory arrays 240 respectively comprises port A signals 245(*a-n*) and port B signals 245(*a-n*), collectively "245." The port A signals 245(*a-n*) and port B signals 245(*a-n*) provide access to the dual ports of the memory arrays 240.

A control logic 210 in the memory device 200 controls access to the memory cells 230. The control logic 210 is responsive to signals received via the I/O pads 220. Signal from the control logic 210 and/or the I/O pads 220 may be operatively coupled to the port A signals 245(*a-n*) and port B signals 245(*a-n*) for accessing the memory arrays 240. The contention margins of the memory arrays 240 are tested using the contention margin testing described herein. This testing may be performed at various stages of processing, as well as post-processing. The results from such testing may be used to perform process adjustment, design adjustment for subsequently manufactured memory devices, and/or to re-characterize the memory device 200 to reflect the actual contention margin.

Figure 3:
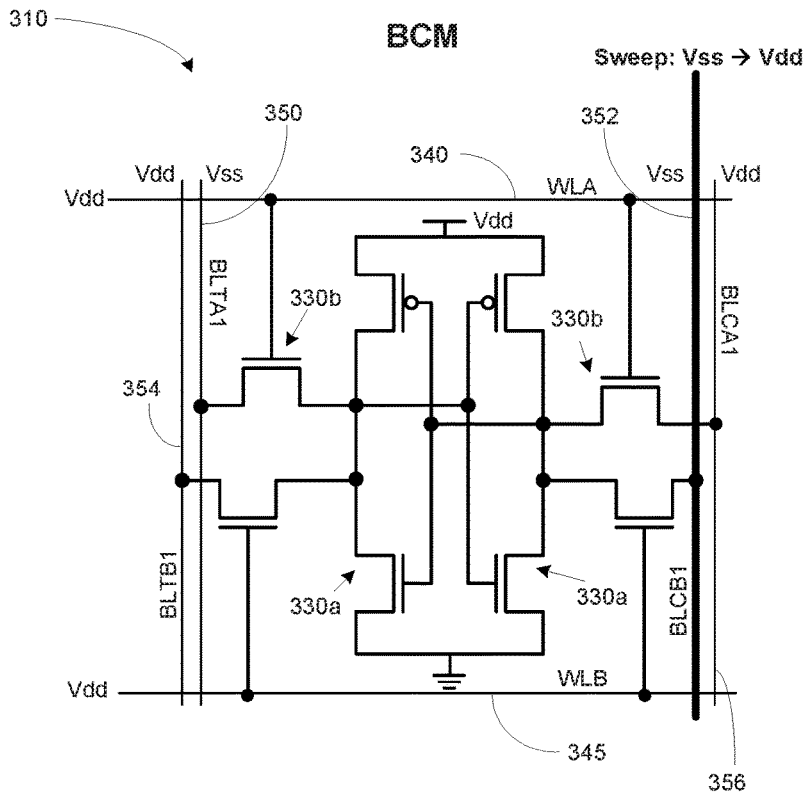
FIG. 3 illustrates a dual port cell of a memory device for performing a bit line contention margin (BCM) test, in accordance with embodiments herein.

Turning now to FIG. 3, a portion of a dual port cell of a memory device for performing a bit line contention margin (BCM) test, in accordance with embodiments herein, is illustrated. A cell 310 comprises a plurality of transistors 330*a* that form two cross-coupled inverters, while additional transistors 330*b* provide access control for read and write operations. For the dual port cell 310, additional transistors 330*b* are provided for dual port access control, as compared to 6 T single port cells.

The dual port memory cell 310 comprises two ports, port A and port B. The cell 310 comprises two word line signals, WLA 340 and WLB 345. Further, the dual port memory cell 310 comprises bit line signals for each port. The cell 310 comprises bit line true signals BLTA1 350 and BLTB1 354 and bit line complimentary signals BLCA1 356, and BLCB1 352 ("A" designation for port A and "B" designation for port B). If a "true" bit line signal is coupled to Vdd, the related "complimentary" bit line signal would be coupled to Vss and vice versa. The word line signals and the bit line signals of FIG. 3 are driven to various assertions states to perform read and write operations using the dual ports (port A and port B) of the memory cell 310.

The BCM test is one embodiment of a DC contention margin test, which may be performed at various stages of manufacture. FIG. 3 exemplifies BCM test based upon a write operation from port A, while port B starts low. In order to perform this BCM test on the cell 310, BLTA1 354 is set to Vss, while its complementary bit line signal BLCA1 is set to Vdd. This configures the cell 310 for a write bit line operation to port A. BLTB1 350 is set to Vss and its complementary bit line signal BLCB1 352 (shown as a darker line) may be initially set to Vss and slowly increased towards Vdd to perform the BCM test. In order to create a DC contention, the word line signals WLA 340 and WLB 345 are both set to Vdd. This configuration mimics an early read operation via port B of the cell 310.

Upon initially setting BLCB1 352 at Vss, the voltage on BLCB1 352 is swept from Vss to Vdd, while internal storage nodes voltages are measured (e.g., CH node 360, CL node 365). In an attempt to write a zero value to the CH node 360, if both BLTA1 350 and BLCB1 352 are both held at Vss, the attempt will fail. As the value of BLCB1 352 is swept from Vss to Vdd, at some point, a write operation to port A is possible. That is, while sweeping the voltage from Vss to Vdd, at some voltage at BLCB1 352, a sufficient differential between CL 365 and CH 360 will develop, which will enable a write operation. In one embodiment, this differential may be defined as Vdd/2. The bit line contention margin (BCM) may be defined as the difference between 1 volt (or Vdd) and the smallest contention bit line voltage at which a write operation on port A is successful under the above conditions. This process may be repeated with respect to other ports in the cell 310.

Figure 4:
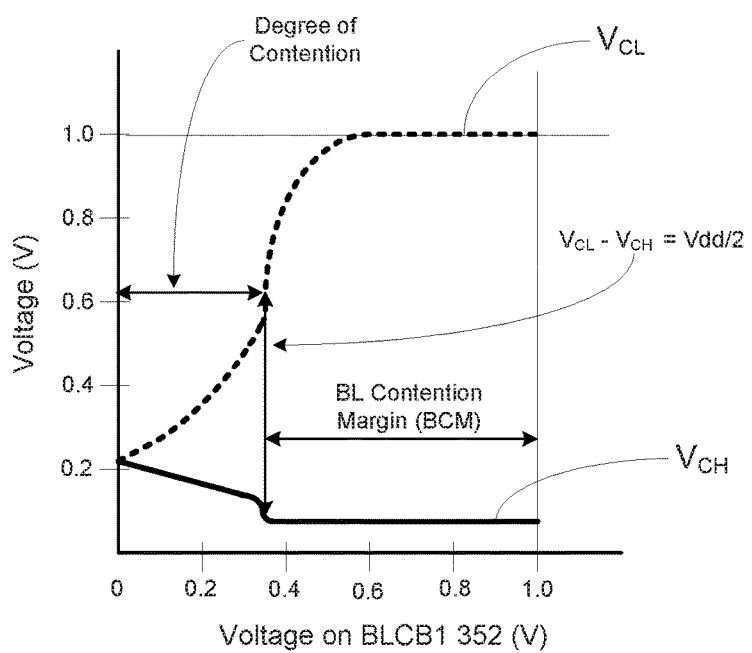
FIG. 4 illustrates a stylized graph of a voltage response based on a BCM test of FIG. 3, in accordance with embodiments herein.

FIG. 4 illustrates a stylized graph of a voltage response based on a BCM test of FIG. 3, in accordance with embodiments herein, is illustrated. FIG. 4 illustrates a graph of the contention voltage on BLCB1 352 versus voltage for the BCM test of FIG. 3. The voltage of the nodes CL 365 and CH 360 are shown as a function of the voltage level of Vdd. As the voltage level of BLCB1 352 is increased towards Vdd, a difference between the nodes CL 365 and CH 360 develops. Eventually, when CL 365 has a voltage of 0.6 Volts and the bit line contention voltage has a voltage near 0.35 Volts, a differential voltage between the nodes CL 365 and CH 360 is equal to Vdd/2, at which a write to CH is possible. This point can define the BCM as being 1 Volt–0.35 Volts, or 0.65 Volts. Generally, the higher the bit line contention margin, the more the cell 310 is immune to read/write contention. Therefore, in this example, if the BCM test reveals a value of 0.65, which may have been defined as the desired specification of the memory device, then the BCM test may be judged as passed. However, if a BCM value of 0.65 is not realized in BCM test, then a design adjustment, a process adjustment, and/or a specification characterization adjustment may be performed.

Figure 5:
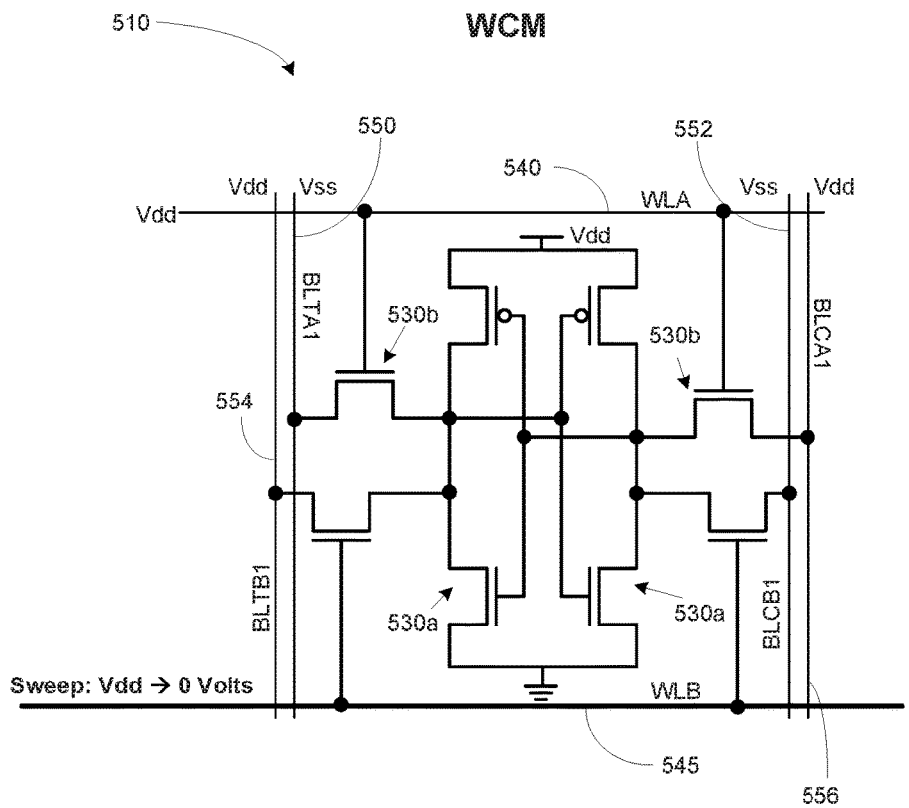
FIG. 5 illustrates a dual port cell of a memory device for performing a word line contention margin (WCM) test, in accordance with embodiments herein.

Turning now to FIG. 5, a portion of a dual port cell of a memory device for performing a word line contention margin (WCM) test, in accordance with embodiments herein, is illustrated. A cell 510 comprises a plurality of transistors 530*a* that form two cross-coupled inverters, while additional transistors 530*b* provide access control for read and write operations. For the dual port cell 510, additional transistors 530*b* (switching transistors) are provided for dual port access control, as compared to 6 T single port cells.

The dual port memory cell 510 comprises two ports, port A and port B. The cell 510 comprises two word line signals, WLA 540 and WLB 545. Further, the dual port memory cell 510 comprises bit line signals for each port. The cell 510 comprises bit line true signals BLTA1 550 and BLTB1 554 and bit line complimentary signals BLCA1 556, and BLCB1 552 ("A" designation for port A and "B" designation for port B). If a "true" bit line signal is coupled to Vdd, the related "complimentary" bit line signal would be coupled to Vss and vice versa, as shown in FIG. 1. The word line signals and the bit line signals of FIG. 5 are driven to various assertions states to perform read and write operations using the dual ports (port A and port B) of the memory cell 510.

The WCM test is another embodiment of a DC contention margin test, which may be performed at various stages of manufacture. For example, the WCM test may be performed by executing a write operation from port A while port B is held low. In this example, a "0" value may be written from the bit line BLTA1 550, pulling node CH 560 from "1" (i.e., high) to "0" (i.e., low).

To perform this test, BLTA1 550 and BLCB1 552 are held at Vss to create a DC contention, i.e., mimicking a write operation on port A and an early read operation on port B. When attempting to perform a write function on port A while performing a write on port B causes it to "fight" the write attempt port A. In this case, this "fight" may be eliminated by slowly turning off the transistor connected to BLTB1 554. When WLB 545 is at Vdd, the transistor connected to BLTB1 554 is on and there exists a DC contention. When WLB 545 is at Vss, the transistor connected to BLTB1 554 is off and there is no DC contention. In order to determine the amount of contention the cell 510 can take, the voltage on WLB 545 is slowly moved from Vdd to zero.

As the voltage on WLB 545 is swept from Vdd to zero, the internal node voltages of the cell 510 may be measured. When WLB 545 is at Vdd, the cell 510 cannot be written since at this point, the bit line BLTB1 554 is "fighting" BLTA1 550. When the voltage on WLB 545 is lowered, at some point prior to going all the way down to zero Volts, a write operation into port A becomes possible. In other words, when WLB 545 is at zero Volts, there is no contention and a write operation to port A is possible. However, as the voltage goes from zero Volts towards Vdd, prior to reaching Vdd, the port B cell turns on more and more. Then at some point, as the port B cell turns sufficiently "on" such that a write operation to port A is not possible. The last voltage level on WLB 545 at which the write operation to port A was possible is the word line underdrive (WL-UD) contention margin. The WL underdrive contention margin may be defined as the highest WL voltage on contention word line (i.e., WLB 545) at which an operation on port A is successful. This level could be described as being the level at which the voltage differential between the CL node 565 and the CH node 560 (VCL–VCH) becomes Vdd divided by two (i.e., VCL–VCH=Vdd/2). This measurement process may be performed on other ports of the memory cell 510.

Figure 6:
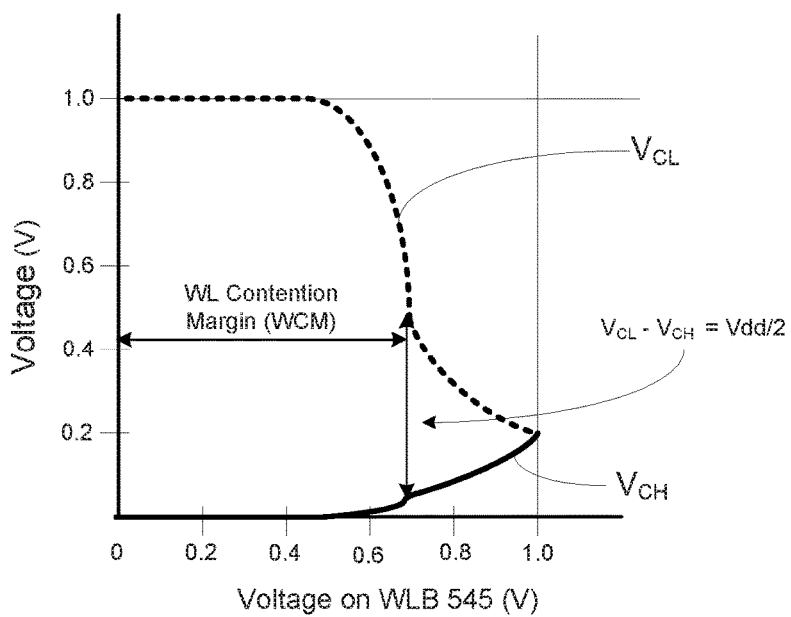
FIG. 6 illustrates a stylized graph of a voltage response based on a WCM test of FIG. 5, in accordance with embodiments herein.

FIG. 6 illustrates a stylized graph of a voltage response based on a WCM test of FIG. 5, in accordance with embodiments herein, is illustrated. FIG. 6 illustrates a graph of the WL contention voltage on WLB 545 versus voltage ($V_{CH}$ or $V_{CL}$) for the WCM test of FIG. 5. The voltage of the nodes CL 565 and CH 560 are shown in relation to the voltage on WLB 545. As the voltage level of WLB 545 is decreased from Vdd toward zero Volts, a voltage difference between the nodes CL 565 and CH 560 develops. Eventually, before WLB 545 is swept to a voltage of 0.6 Volts, a differential voltage between the nodes CL 565 and CH 560 is equal to Vdd/2, at which point a write to port A becomes possible. The voltage of WLB 545 at this point can be defined as the WL contention margin. Generally, the higher the WL contention margin, the more the cell 510 is immune to read/write contention. Therefore, in this example, if the WCM test reveals a 0.6, which may have been defined as the desired specification of the memory device, then the WCM test may be judged as passed. However, if a WCM of 0.6 is not realized in the WCM test, then a design adjustment, a process adjustment, and/or an adjustment of the specification characterization of the memory device may be performed.

Figure 7:
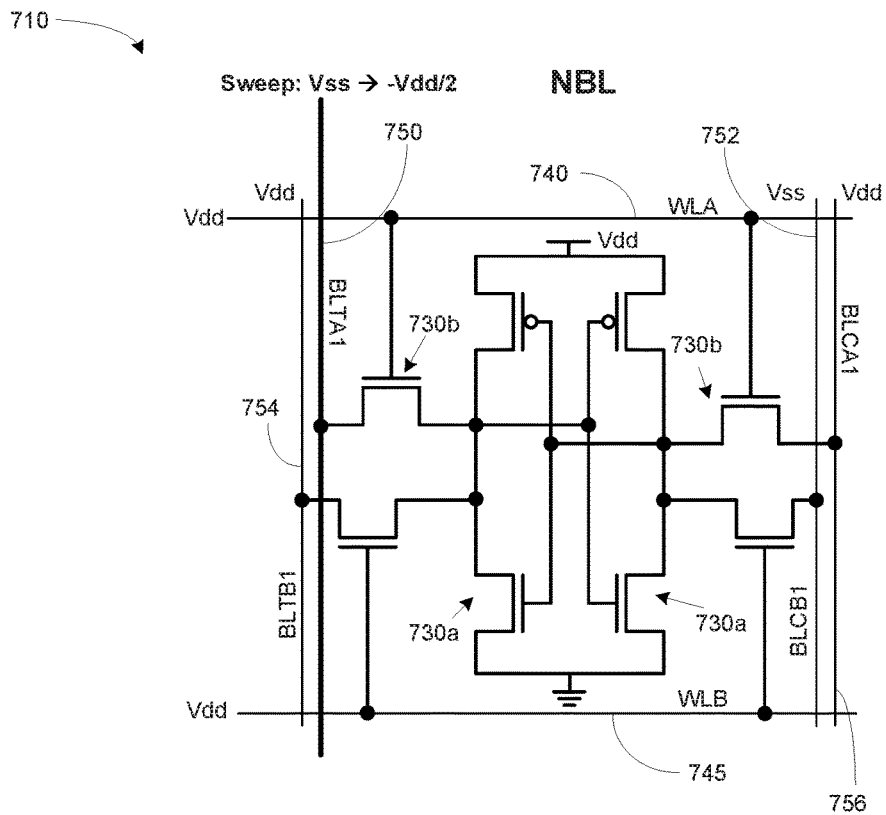
FIG. 7 illustrates a portion of a dual port cell of a memory device for performing a negative bit line (BL) contention margin test, in accordance with embodiments herein.

Turning now to FIG. 7, a portion of a dual port cell of a memory device for performing a negative bit line (BL) contention margin test, in accordance with embodiments herein, is illustrated. A cell 710 comprises a plurality of transistors 730*a* that form two cross-coupled inverters, while additional transistors 730*b* provide access control for read and write operations, similar to the manner described in FIG. 3

The dual port memory cell 710 comprises two ports, port A and port B. The cell 710 comprises two word line signals, WLA 740 and WLB 745. Further, the dual port memory cell 710 comprises bit line signals for each port. The cell 710 comprises bit line true signals BLTA1 750 and BLTB1 754 and bit line complimentary signals BLCA1 756, and BLCB1 752 ("A" designation for port A and "B" designation for port B). If a "true" bit line signal is coupled to Vdd, the related "complimentary" bit line signal would be coupled to Vss and vice versa. The word line signals and the bit line signals of FIG. 7 are driven to various assertions states to perform read and write operations using the dual ports (port A and port B) of the memory cell 710.

The negative BL test is yet another embodiment of a DC contention margin test, which may be performed at various stages of manufacture. FIG. 7 exemplifies negative BL test based upon a write operation from port A, while port B is held low. The negative BL test is similar to the BCM test described above, however, instead to sweeping BLCB1 752 from Vss to Vdd, in the negative BL test, the BLTA1 voltage level is pushed further negative, i.e., being swept from Vss to –Vdd/2.

In order to perform the negative BL test on the cell 710, BLCB1 752 is set to Vss, while its complementary bit line signal BLTB1 754 is set to Vdd. This configures the cell 710 for a write bit line operation to port A, while port B is held low (inactive). BLCA1 756 is set to Vss and its complementary bit line signal BLTA1 750 (shown as a darker line) may be initially set to Vss and slowly decreased towards minus Vdd/2 or Vdd. In this case, using a negative voltage, the transistor of port A turns on in a stronger fashion.

In order to create a DC contention, the word line signals WLA 740 and WLB 745 are both set to Vdd. This configuration mimics an early read operation via port B of the cell 710. Upon initially setting BLCB1 752 at Vss, the voltage on BLCA1 750 is swept from Vss to minus Vdd/2 or to minus Vdd, while internal notes voltages are measured (e.g., CH node 760, CL node 765). In an attempt to write a zero value to the CH node 760, if both BLCB1 752 and BLCA1 750 are both held at Vss, the attempt will fail. As the value of BLCA1 750 is swept from Vss to −Vdd/2, at some point, a write operation to port A is possible, i.e., CH node voltage ($V_{CH}$) is zero. That is, while sweeping the voltage from Vss to −Vdd/2, at some voltage at BLCA1 750, a sufficient differential between CL 765 and CH 760 will develop, which will enable a write operation. In one embodiment, this differential may be defined as Vdd/2. The bit line contention margin may be defined as the smallest contention bit line voltage at which operation on port A is successful. This process maybe be repeated for other ports in the cell 710.

Figure 8:
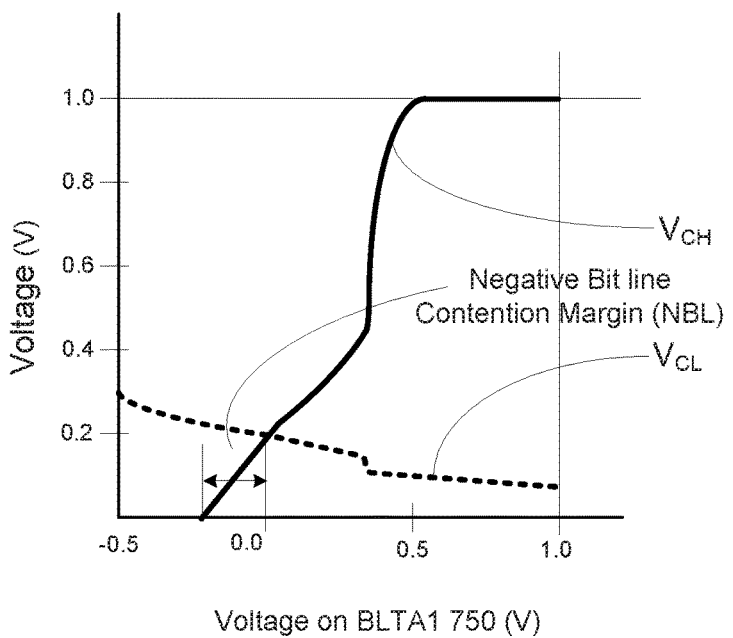
FIG. 8 illustrates a stylized graph of a voltage response based on a negative BL test of FIG. 7, in accordance with embodiments herein.

FIG. 8 illustrates a stylized graph of a voltage response based on a negative BL test of FIG. 7, in accordance with embodiments herein, is illustrated. FIG. 8 illustrates a graph of the contention voltage versus CH node voltage (VCH) or Vdd. The voltage of the nodes CL 765 and CH 760 are shown as a function of the voltage level of Vdd or VCH. As the voltage level of BLTA1 750 decreases towards −Vdd/2, a difference between the nodes CL 765 and CH 760 develops. Eventually, during the period when there is a positive differential between the VCL and VCH (i.e., contention BL voltage Vdd voltage or VCH of 0 Volts), a differential voltage between the nodes CL 765 and CH 760 allow for a write operation to CH. This range can be defined as the contention margin. Generally, the higher in magnitude the bit line contention margin, the more the cell 710 is immune to read/write contention. Therefore, in this example, if the negative BL test reveals a −0.3 contention BL voltage, which may have been defined as the desired specification of the memory device, and then the negative BL test may be judged as passed. However, if a contention of −0.3 is not realized in the negative BL test, then a design adjustment, a process adjustment, and/or a specification-characterization adjustment may be performed.

Figure 9:
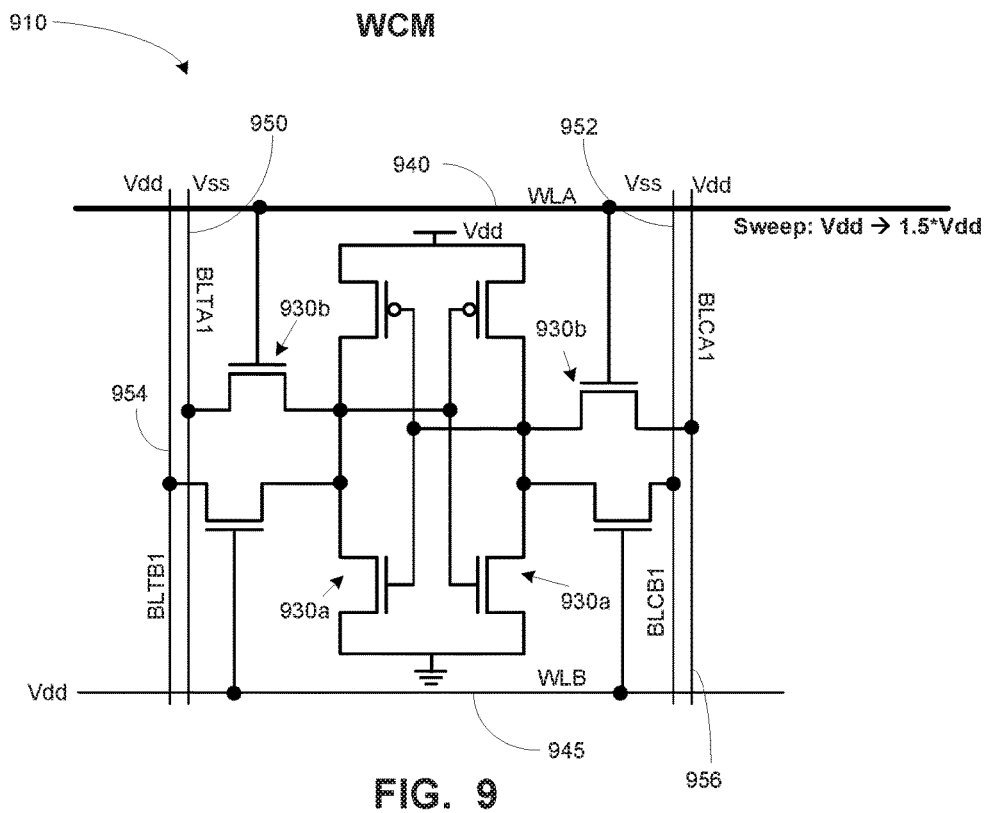
FIG. 9 illustrates a portion of a dual port cell of a memory device for performing a word line (WL) overdrive test, in accordance with embodiments herein.

Turning now to FIG. 9, a portion of a dual port cell of a memory device for performing a word line (WL) overdrive test, in accordance with embodiments herein, is illustrated. A cell 910 comprises a plurality of transistors 930*a* that form two cross-coupled inverters, while additional transistors 930*b* provide access control for read and write operations. For the dual port cell 910, additional transistors 930*b* (switching transistors) are provided for dual port access control.

The dual port memory cell 910 comprises two ports, port A and port B. The cell 910 comprises two word line signals, WLA 940 and WLB 945. Further, the dual port memory cell 910 comprises bit line signals for each port. The cell 910 comprises bit line true signals BLTA1 950 and BLTB1 954 and bit line complimentary signals BLCA1 956, and BLCB1 952 ("A" designation for port A and "B" designation for port B). If a "true" bit line signal is coupled to Vdd, the related "complimentary" bit line signal would be coupled to Vss and vice versa, as shown in FIG. 1. The word line signals and the bit line signals of FIG. 9 are driven to various assertions states to perform read and write operations using the dual ports (port A and port B) of the memory cell 910.

The WL overdrive test is another embodiment of a DC contention margin test, which may be performed at various stages of manufacture. For example, the WL overdrive test may be performed by executing a write operation from port A while port B is held low. In this example, a "0" value may be written into the bit line BLTA1 950, pulling node CH 960 from "1" (i.e., high) to "0" (i.e., low).

To perform this test, BLTA1 950 and BLCB 956 are held at Vss to create a DC contention, i.e., mimicking a write operation on port A and a early read operation on port B. When attempting to perform a write function on port A while performing a write on port B, this conflict causes it to "fight" the write attempt port A. In this case, this "fight" may be eliminated by slowly strengthening the transistor connected to WLA 940 in the on position. Unlike the WCM test, where the voltage on WLB 945 was swept from Vdd to zero, in the WOM test, the voltage on WLA is swept further positive, e.g., towards 1.5 times Vdd. That is, the BLTA1 950 side is made stronger than the BLTB1 954 side. Therefore, the WL overdrive test may provide an indication regarding how much "competition" from the BLTB1 954 side can the BLTA1 950 can take.

As the voltage on WLA 940 is swept from Vdd to 1.5×Vdd, the internal node voltages of the cell 910 may be measured. At this point, the bit line BLTA1 950 is "fighting" BLTB1 954. When the voltage on WLA 940 is increased, at some point prior to going all the way up to 1.5 times Vdd Volts, a write operation into port A becomes possible. In other words, when the voltage of WLB 945 is far below of that of WLA 940, there is no contention, and thus, a write operation to port A is possible. As the voltage of WLA 940 goes from Vdd towards 1.5 times Vdd, prior to reaching 1.5×Vdd, the port A cell turns "on" stronger and stronger. Then at some point, as port A cell turns sufficiently "on" such that a write operation to port A is possible. The last voltage level on WLA 940 at which the write operation to port A was not possible is the word line overdrive contention margin. The WL overdrive contention margin may be defined as the minimum overdrive voltage level on WLA 940 at which a write operation on port A is successful. The level at which a write operation on port A becomes successful could be described as the voltage level of WLA 940 at which the voltage differential between the CH node 960 and the CL node 965 (VCH−VCL) becomes Vdd divided by two (i.e., VCL−VCH=Vdd/2). This measurement process may be performed on other ports of the memory cell 910.

Figure 10:
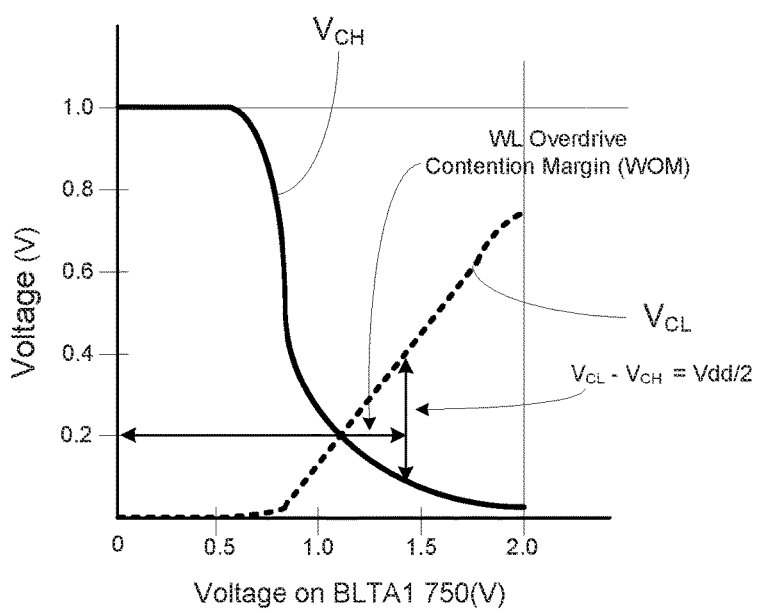
FIG. 10 illustrates a stylized graph of a voltage response based on a WL overdrive test of FIG. 9, in accordance with embodiments herein.

FIG. 10 illustrates a stylized graph of a voltage response based on a WL overdrive test of FIG. 9, in accordance with embodiments herein, is illustrated. FIG. 10 illustrates a graph of the WL contention voltage on WLA 940 versus voltage level ($V_{CH}$ or $V_{CL}$) for the WL overdrive test of FIG. 9. The voltages of the nodes CL 965 and CH 960 are shown in relation to the voltage on WLA 940. As the voltage level of WLA 940 is increased from Vdd toward 1.5×Vdd Volts, a voltage difference between the nodes CL 965 and CH 960 develops. Eventually, at WLA 540 voltage of 1.3 Volts, a differential voltage between the nodes CL 965 and CH 960 is equal to Vdd/2, at which a write to port A is possible. This point can be defined as the WL overdrive contention margin. Generally, the higher the WL overdrive contention margin, the more the cell 910 is immune to read/write contention. Therefore, in this example, if the WL overdrive test reveals a 1.3, which may have been defined as the desired specification of the memory device, then the WL overdrive test may be judged as passed. However, if a WL overdrive of 1.3 is not realized in the WL overdrive test, then a design adjustment, a process adjustment, and/or an adjustment of the specification characterization of the memory device may be performed.

Figure 11:
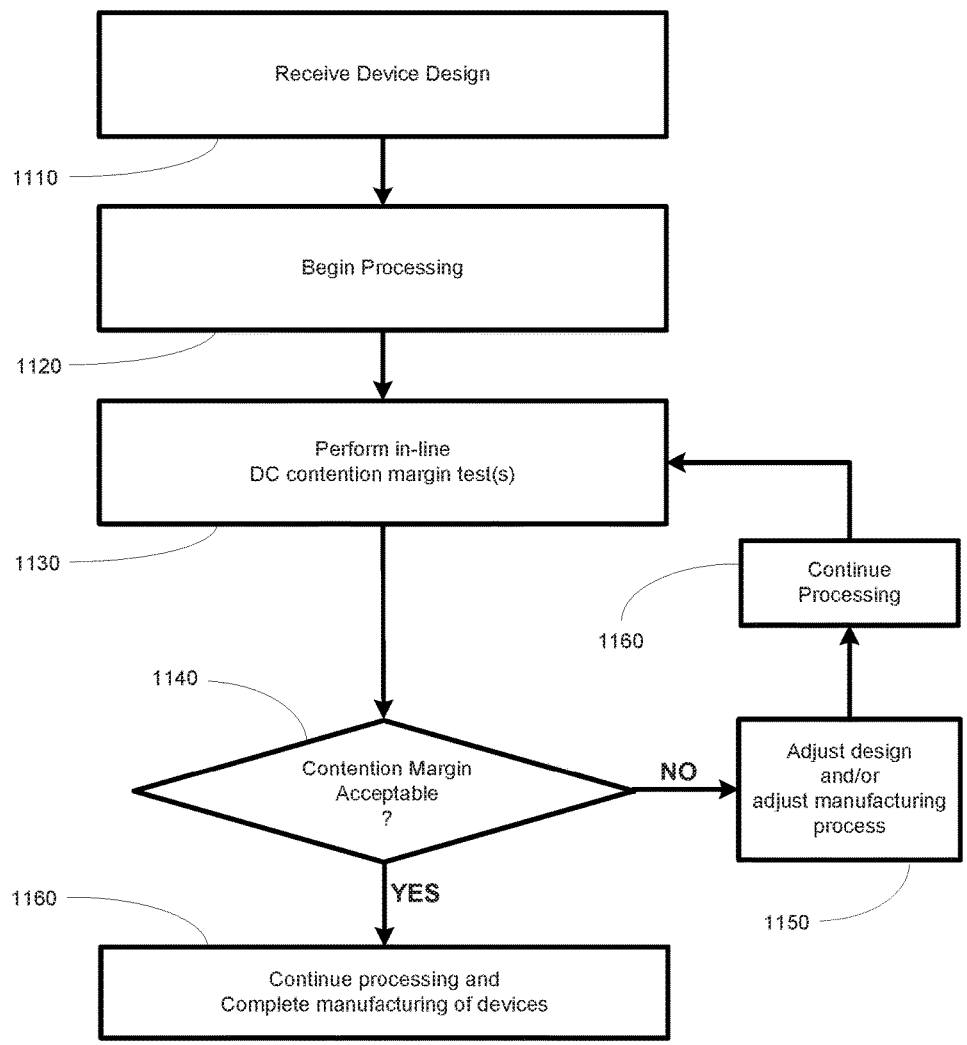
FIG. 11 illustrates a flowchart depiction of a typical method for performing a contention margin test, in accordance with embodiments herein.

Turning now to FIG. 11, a flowchart depiction of a typical method for performing a contention margin test, in accordance with embodiments herein, is illustrated. A device design for manufacturing a memory device is received (at 1110). Based on this design, processing of semiconductor wafers may be performed (at 1120). One or more inline DC contention margin tests may be performed (at 1130). The DC test may be one or more of the BCM test, the WCM test, the negative BL test, and/or the WL overdrive test.

Based upon performing the inline DC test(s), a determination may be made as to whether the contention margin determined from the DC test(s) is acceptable (at 1140). For example, the measured contention margin may be compared to a predetermined range of acceptable contention margin values or threshold(s) in order to determine whether the contention margin determined from the DC test(s) is acceptable. If a determination is made that the contention margin is acceptable, the processing of the semiconductor wafers may continue and the manufacturing of the memory devices are completed (at 1170).

If determination is made that the contention margin is not acceptable, the design of the device (e.g., transistor parameters, etc.) may be adjusted (at 1150). Moreover, alternatively or in addition, one or more manufacturing process parameters may be adjusted to modify the contention margin (at 1150). Based upon these modifications, the processing may be continued and one or more DC test may be performed followed by the processes described in blocks 1140 and 1170.

Figure 12:
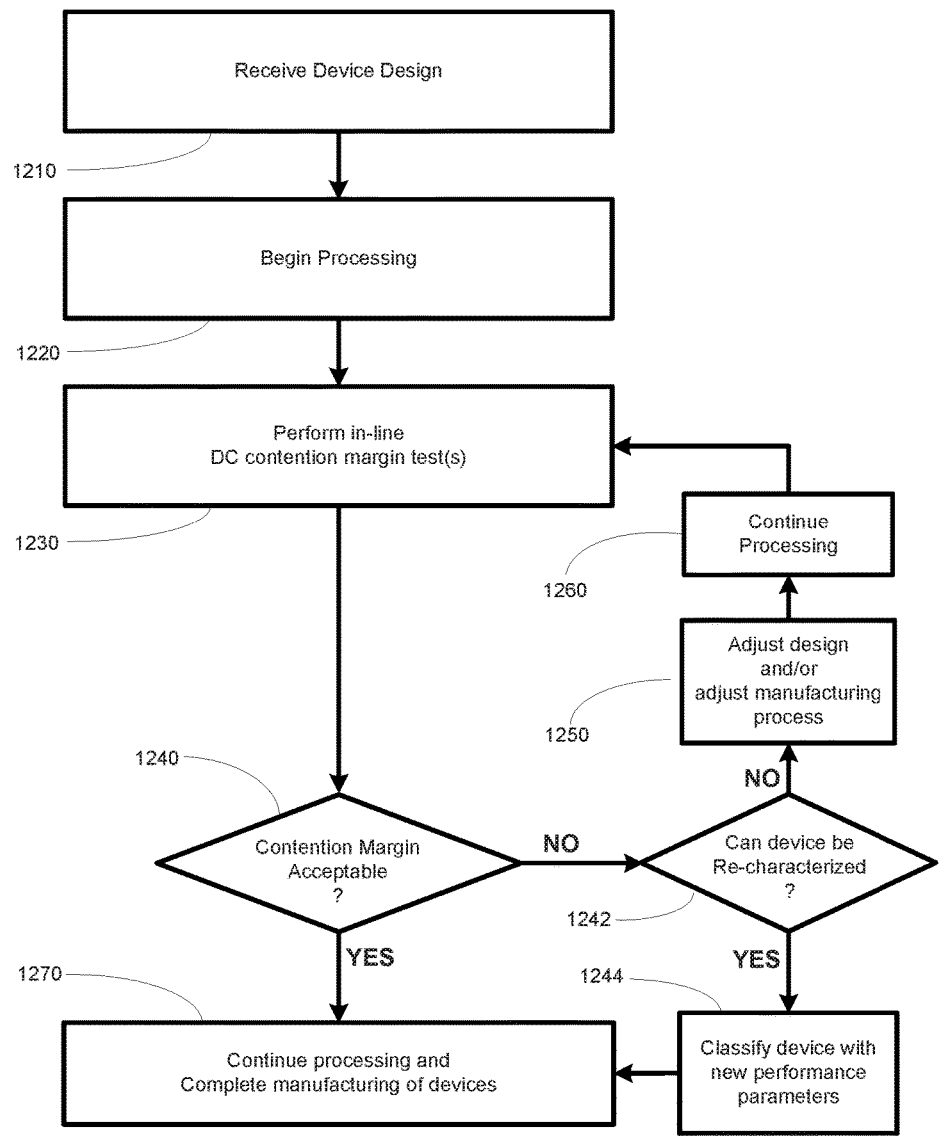
FIG. 12 illustrates a flowchart depiction of a typical method for performing a contention margin test, in accordance with an alternative embodiment herein; implementation.

Turning now to FIG. 12, a flowchart depiction of a typical method for performing a contention margin test, in accordance with an alternative embodiment herein, is illustrated. A device design for manufacturing a memory device is received (at 1210). Based on this design, processing of semiconductor wafers may be performed (at 1220). One or more inline DC contention margin tests may be performed (at 1230). The DC test may be one or more of the BCM test, the WCM test, the negative BL test, and/or the WL overdrive test.

Based upon performing the inline DC test(s), a determination may be made as to whether the contention margin determined from the DC test(s) is acceptable (at 1240), e.g., comparing the measured contention margin to a predetermined threshold or range of values. If a determination is made that the contention margin is acceptable, the processing of the semiconductor wafers may be continued and the manufacturing of the memory devices are completed (at 1270).

If determination is made that the contention margin is not acceptable, a determination is made as to whether the devices being manufactured could be re-classified to match the measured contention margin (at 1242). If the determination at 1242 is in the affirmative, then the devices being manufactured are re-classified with new performance parameters that are consistent with the measured contention margins (at block 1244). The processing of the semiconductor wafers may continue and the manufacturing of the memory devices are completed (at 1270).

If a determination is made that the devices being manufactured could not be re-classified to match the measured contention margin, the design of the device (e.g., transistor parameters, etc.) may be adjusted (at 1250). Further, alternatively or in addition, one or more manufacturing process parameters may be adjusted to modify the contention margin (at 1250). Based upon these modifications, the processing may be continued and one or more DC test may be performed followed by the processes described in blocks 1240 and 1270.

Figure 13:
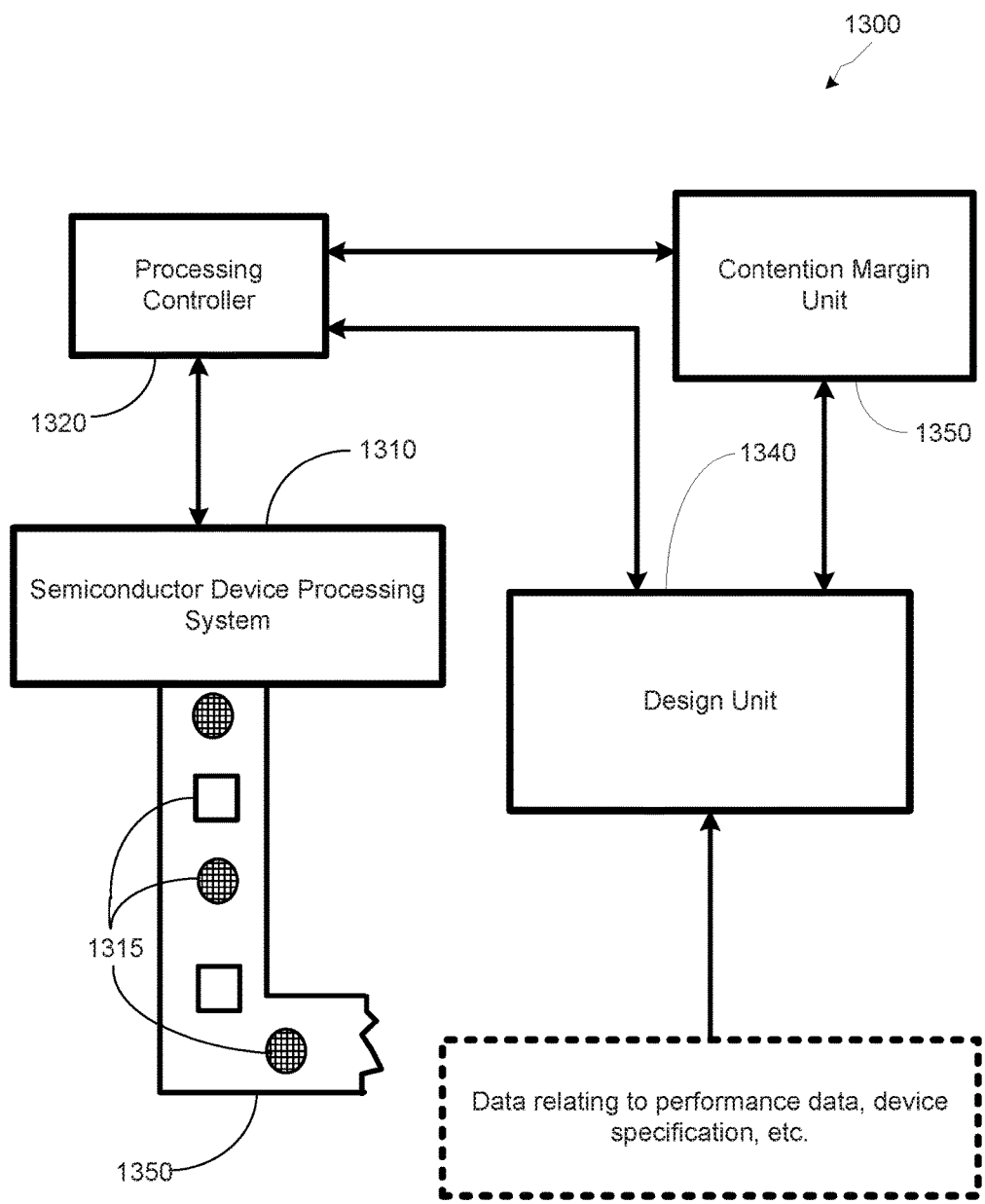
FIG. 13 illustrates a stylized depiction of a system capable of testing and/or manufacturing memory devices, in accordance with embodiment herein.

Turning now to FIG. 13, a stylized depiction of a system for fabricating a semiconductor device package comprising cross couple design, in accordance with embodiments herein, is illustrated. The system 1300 of FIG. 13 may comprise a semiconductor device processing system 1310 and a design unit 1340. The semiconductor device processing system 1310 may manufacture integrated circuit devices based upon one or more designs provided by the design unit 1340.

The semiconductor device processing system 1310 may comprise various processing stations, such as etch process stations, photolithography process stations, CMP process stations, etc. One or more of the processing steps performed by the processing system 1310 may be controlled by the processing controller 1320. The processing controller 1320 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1310 may produce integrated circuits on a medium, such as silicon wafers. More particularly, the semiconductor device processing system 1310 produce dual port memory devices described above.

The manufacturing of integrated circuits by the device processing system 1310 may be based upon the circuit designs provided by the integrated circuits design unit 1340. The processing system 1310 may provide processed integrated circuits/devices 1315 on a transport mechanism 1350, such as a conveyor system. In some embodiments, the conveyor system may be sophisticated clean room transport systems that are capable of transporting semiconductor wafers. In one embodiment, the semiconductor device processing system 1310 may comprise a plurality of processing steps, e.g., the $1^{st}$ process step, the $2^{nd}$ process set, etc., as described above.

In some embodiments, the items labeled "1315" may represent individual wafers, and in other embodiments, the items 1315 may represent a group of semiconductor wafers, e.g., a "lot" of semiconductor wafers. The integrated circuits or device 1315 may be memory devices, such as SRAM devices.

The integrated circuit design unit 1340 of the system 1300 is capable of providing a circuit design that may be manufactured by the semiconductor processing system 1310. The integrated circuit design unit 1340 may receive various types of data including performance data, device specification, contention margins, etc. Using such data, the design unit 1340 may provide various process definitions based on the data that includes performance data, device specification, etc. Based upon such details of the devices, the integrated circuit design unit 1340 may determine specifications of the memory devices (e.g., contention margins) that are to be manufactured using the processes described above. Based upon these specifications, the integrated circuit design unit 1340 may provide data for manufacturing semiconductor device packages that comprise memory devices (e.g., SRAM devices) described herein.

The system 1300 may also comprise a contention margin unit 1350. The contention margin unit 1350 is capable of performing in-line DC contention margin tests described herein. Based on the contention margins determined by the contention margin unit 1350, the design data provided by the design unit 1340 may be modified and/or the processing parameters may be adjusted.

The system 1300 may be capable of performing analysis and manufacturing of various products involving various technologies. For example, the system 1300 may design and production data for manufacturing devices of CMOS technology, Flash technology, BiCMOS technology, power devices, memory devices (e.g., SRAM devices, DRAM devices), NAND memory devices, and/or various other semiconductor technologies.

The methods described above may be governed by instructions that are stored in a non-transitory computer readable storage medium and that are executed by, e.g., a processor in a computing device. Each of the operations described herein (e.g., FIGS. 12-13) may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   processing a semiconductor wafer for providing a dual port memory device;
   performing an inline DC contention margin test for testing a contention margin related to a write operation into a cell of said memory device;
   determining whether said contention margin is within a predetermined range; and
   performing a responsive action in response to determining that said contention margin is outside said predetermine range.

2. The method of claim 1, wherein performing an inline DC contention margin test comprises at least one of:
   performing a DC bit line contention margin (BCM) test;
   performing a DC word line contention margin (WCM) test;
   performing a DC negative bit line (BL) contention margin (NBL) test; and
   performing a DC overdrive word line (WL) contention margin (WOM) test.

3. The method of claim 2, wherein performing said DC bit line contention margin (BCM) test comprises:
   holding a bit line of a first port of a memory cell of said memory device at logic low level;
   holding a first word line of said first port and a second word line of said second port of said memory cell at logic high;
   sweeping a bit line complementary signal of a second port of said memory cell from logic low to logic high;
   determining the voltage level of said bit line complementary signal at which a write to said first port is possible; and
   determining a bit line contention margin of said memory cell based upon said voltage level.

4. The method of claim 3, further comprising performing a write function into said first port to determine said voltage level of said bit line complementary signal at which a write to said first port is possible.

5. The method of claim 2, wherein performing said DC word line contention margin (WCM) test comprises:
   writing a logic low value into a CH storage node of a memory cell;
   holding a bit line of a first port of a memory cell of said memory device and a complementary bit line of a second port of a memory cell at logic low level for causing a DC contention;
   holding a first word line of said first port of said memory cell at logic high;
   sweeping a second word line of a second port of said memory cell from logic high to logic low;
   determining the voltage level of said second word line at which a write to said first port is possible; and
   determining a word line DC contention margin of said memory cell based upon said voltage level.

6. The method of claim 2, wherein performing said DC negative bit line (BL) contention margin (NBL) test comprises:
   holding a bit line complementary signal of a second port of a memory cell of said memory device at logic low level;
   holding a first word line of said first port and a second word line of said second port of said memory cell at logic high;
   sweeping a bit line signal of a first port of said memory cell from logic low to a negative voltage;
   determining the voltage level of said bit line signal at which a write to said first port is possible; and
   determining a bit line contention margin of said memory cell based upon said voltage level.

7. The method of claim 6, wherein sweeping a bit line signal of a first port of said memory cell from logic low to a negative voltage comprises sweeping said bit line signal of said first port from zero volts to at least one of −Vdd or −Vdd divided by two.

8. The method of claim 2, wherein performing said DC overdrive word line contention margin (WOM) test comprises:
   writing a logic low value into a CH storage node of a memory cell;
   holding a bit line of a first port of a memory cell of said memory device and a complementary bit line of a second port of a memory cell at logic low level for causing a DC contention;
   holding a first word line of said second port of said memory cell at logic high;
   sweeping a second word line of a first port of said memory cell from logic high to voltage level above said logic high;
   determining the voltage level of said first word line at which a write to said first port is possible; and determining an overdrive DC contention margin of said memory cell based upon said voltage level.

9. The method of claim 8, wherein sweeping said second word line of a first port of said memory cell from logic high to voltage level above said logic high comprises sweeping said second word line from logic high to 1.5 times said logic high.

10. The method of claim 2, wherein:
performing said BCM test comprises performing said BCM test on a plurality of ports of a memory cell of said memory device;
performing said WCM test comprises performing said WCM test on a plurality of ports of a memory cell of said memory device;
performing said NBL test comprises performing said NBL test on a plurality of ports of a memory cell of said memory device; and
performing said WOM test comprises performing said WOM test on a plurality of ports of a memory cell of said memory device.

11. The method of claim 1, wherein, performing said responsive action comprises performing at least one of:
adjusting a design of said memory device;
adjusting a process parameter of said processing of said semiconductor wafer; or
re-characterizing said memory device to conform to said determined contention margin.

12. The method of claim 1, wherein performing said inline DC contention margin test comprises performing said DC contention margin test during a metal deposition stage of said processing of said semiconductor wafer.

13. A method, comprising:
processing a semiconductor wafer for manufacturing an integrated circuit comprising a dual port memory cell;
determining a DC contention margin of said dual port memory cell to a write operation of said memory cell;
determining whether said contention margin is within a predetermined range; and
performing a responsive action in response to determining that said contention margin is outside said predetermine range; said response action comprising at least one of adjusting a design of said memory device, adjusting a process parameter of said processing of said semiconductor wafer, or re-characterizing said memory device to conform to said determined contention margin.

14. The method of claim 13, wherein determining a DC contention margin comprises performing a bit line contention margin (BCM) test, wherein said BCM test comprises:
holding a bit line of a first port of a memory cell of said memory device at logic low level;
holding a first word line of said first port and a second word line of said second port of said memory cell at logic high;
sweeping a bit line complementary signal of a second port of said memory cell from logic low to logic high;
determining the voltage level of said bit line complementary signal at which a write to said first port is possible; and
determining a bit line contention margin of said memory cell based upon said voltage level.

15. The method of claim 13, wherein determining a DC contention margin comprises performing a word line contention margin (WCM) test, wherein said WCM test comprises:
writing a logic low value into a CH storage node of a memory cell;
holding a bit line of a first port of a memory cell of said memory device and a complementary bit line of a second port of a memory cell at logic low level for causing a DC contention;
holding a first word line of said first port of said memory cell at logic high;
sweeping a second word line of a second port of said memory cell from logic high to logic low;
determining the voltage level of said second word line at which a write to said first port is possible; and
determining a word line DC contention margin of said memory cell based upon said voltage level.

16. The method of claim 15, wherein performing said WCM test comprises determining a word line underdrive contention margin characterized by the differential voltage between said CH storage node and a CL storage node.

17. A system, comprising:
a semiconductor device processing system to manufacture a semiconductor device comprising at least one dual port memory cell; and
a processing controller operatively coupled to said semiconductor device processing system, said processing controller configured to control an operation of said semiconductor device processing system;
wherein said semiconductor device processing system is adapted to:
process a semiconductor wafer for manufacturing an integrated circuit comprising a dual port memory cell;
determine a DC contention margin of said dual port memory cell to a write operation of said memory cell;
determine whether said contention margin is within a predetermined range; and
perform a responsive action in response to determining that said contention margin is outside said predetermine range.

18. The system of claim 17, further comprising a design unit configured to generate a first design comprising a definition for said dual port memory cell, wherein data from said design unit is used by said process controller to control an operation of said semiconductor device processing system, and wherein said memory cell is used to form an SRAM memory device.

19. The system of claim 17, wherein said semiconductor device processing system comprises a contention margin unit capable for preforming at least one of a DC bit line contention margin (BCM) test, a DC word line contention margin (WCM) test, a DC negative bit line (BL) contention margin (NBL) test, and a DC overdrive word line (WL) contention margin (WOM) test, for determining said DC contention margin.

20. The system of claim 19, wherein:
said BCM test comprises:
holding a bit line of a first port of a memory cell of said memory device at logic low level;
holding a first word line of said first port and a second word line of said second port of said memory cell at logic high;
sweeping a bit line complementary signal of a second port of said memory cell from logic low to logic high;
determining the voltage level of said bit line complementary signal at which a write to said first port is possible; and determining a bit line contention margin of said
memory cell based upon said voltage level and said WCM test comprises:
writing a logic low value into a CH storage node of a memory cell;
holding a bit line of a first port of a memory cell of said memory device and a complementary bit line of a second port of a memory cell at logic low level for causing a DC contention;
holding a first word line of said first port of said memory cell at logic high;
sweeping a second word line of a second port of said memory cell from logic high to logic low;
determining the voltage level of said second word line at which a write to said first port is possible; and
determining a word line DC contention margin of said memory cell based upon said voltage level.

* * * * *